(12) United States Patent
Karashima et al.

(10) Patent No.: US 7,820,021 B2
(45) Date of Patent: Oct. 26, 2010

(54) FLIP CHIP MOUNTING METHOD AND METHOD FOR CONNECTING SUBSTRATES

(75) Inventors: Seiji Karashima, Osaka (JP); Takashi Kitae, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 365 days.

(21) Appl. No.: 12/078,891

(22) Filed: Apr. 8, 2008

(65) Prior Publication Data

US 2009/0126876 A1    May 21, 2009

Related U.S. Application Data

(62) Division of application No. 11/887,331, filed as application No. PCT/JP2006/305274 on Mar. 16, 2006, now Pat. No. 7,531,385.

(30) Foreign Application Priority Data

Mar. 29, 2005    (JP)    ............... 2005-094233

(51) Int. Cl.
C25B 9/00 (2006.01)
C25C 7/00 (2006.01)
C25D 17/00 (2006.01)
B22D 37/00 (2006.01)
B22D 39/00 (2006.01)
B22D 41/00 (2006.01)
B22D 45/00 (2006.01)
H01L 21/00 (2006.01)

(52) U.S. Cl. ............... 204/242; 438/108; 257/E23.067; 222/590

(58) Field of Classification Search .............. 228/56.3; 174/261; 359/291; 222/590, 591, 593; 204/242, 204/409, 601, 157.6, 194, 198, 199, 280; 257/E21.175, E21.503, E21.511, E21.502, 257/E23.067, E23.068, E23.125; 438/108, 438/107, 106

See application file for complete search history.

(56) References Cited

U.S. PATENT DOCUMENTS 5,672,260 A * 9/1997 Carey et al. ................. 205/118

(Continued)

FOREIGN PATENT DOCUMENTS

JP    01-157796    6/1989

(Continued)

OTHER PUBLICATIONS

Rito, Masahiro et al., "Assembly Process by Electrically Conductive Adhesive Using Low Melting Point Fillers," 9th Symposium on "Microjoining and Assembly Technology in Electronics," Feb. 6-7, 2003, Yokohama.

(Continued)

*Primary Examiner*—Walter L Lindsay, Jr.
(74) *Attorney, Agent, or Firm*—McDermott Will & Emery LLP

(57) ABSTRACT

A flip chip mounting method which is applicable to the flip chip mounting of a next-generation LSI and high in productivity and reliability as well as a method for connecting substrates are provided. A circuit board 10 having a plurality of connecting terminals 11 and a semiconductor chip 20 having a plurality of electrode terminals 21 are disposed in mutually facing relation and a resin 13 containing conductive particles 12 and a gas bubble generating agent is supplied into the space therebetween. In this state, the resin 13 is heated to generate gas bubbles 30 from the gas bubble generating agent contained in the resin 13. The resin 13 is pushed toward the outside of the generated gas bubbles 30 by the growth thereof. The resin 13 pushed to the outside is self-assembled in the form of columns between the respective terminals of the circuit board 10 and the semiconductor chip 20. In this state, by pressing the semiconductor chip 20 against the circuit board 10, the conductive particles 12 contained in the resin 13 self-assembled between the facing terminals are brought into contact with each other to provide electrical connection between the terminals.

2 Claims, 8 Drawing Sheets

U.S. PATENT DOCUMENTS

| | | | |
|---|---|---|---|
| 5,904,156 A * | 5/1999 | Advocate et al. | 134/2 |
| 6,020,059 A * | 2/2000 | Yamada et al. | 428/328 |
| 6,213,356 B1 * | 4/2001 | Nakasu et al. | 222/590 |
| 7,524,748 B2 * | 4/2009 | Fujimoto et al. | 438/597 |
| 7,638,883 B2 * | 12/2009 | Karashima et al. | 257/778 |
| 2007/0152016 A1 * | 7/2007 | Choe et al. | 228/56.3 |
| 2009/0203170 A1 * | 8/2009 | Nakatani et al. | 438/108 |

FOREIGN PATENT DOCUMENTS

| | | |
|---|---|---|
| JP | 06-125169 | 5/1994 |
| JP | 11-186334 | 7/1999 |
| JP | 2000-094179 | 4/2000 |
| JP | 2000-332055 | 11/2000 |
| JP | 2002-026070 | 1/2002 |
| JP | 2002-329745 | 11/2002 |
| JP | 2004-260131 | 9/2004 |

OTHER PUBLICATIONS

Yasuda, Masahiro et al., "Self-Organized Joining Assembly Process by Electrically Conductive Adhesive Using Low Melting Point Fillers," 10th Symposium on "Microjoining and Assembly Technology in Electronics," Feb. 5-6, 2004, Yokohama.

Yasuda, Kiyokazu et al., "Self-Organized Packaging using Polymer Containing Low-Melting-Point-Metal Filler-Process Simulation of Viscous Multi Phase Flow Fluid," 11th Symposium on "Microjoining and Assembly Technology in Electronics," Feb. 3-4, 2005, Yokohama.

Yamada, Takayuki et al., "Self-Organized Packaging by Polymer Containing Low Melting Point Metal-Experimental Verification of Process Rule Factors of Self-organization," 11th Symposium on "Microjoining and Assembly Technology in Electronics," Feb. 3-4, 2005, Yokohama.

* cited by examiner

FIG. 2
(a) 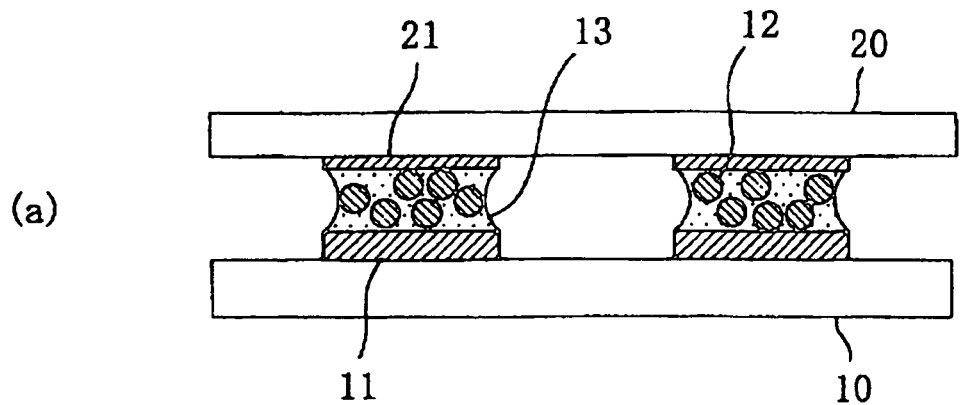
(b) 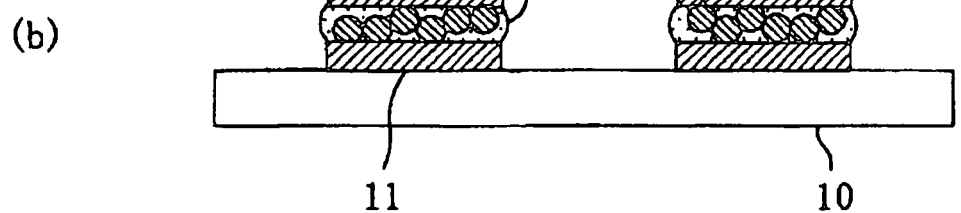
(c) 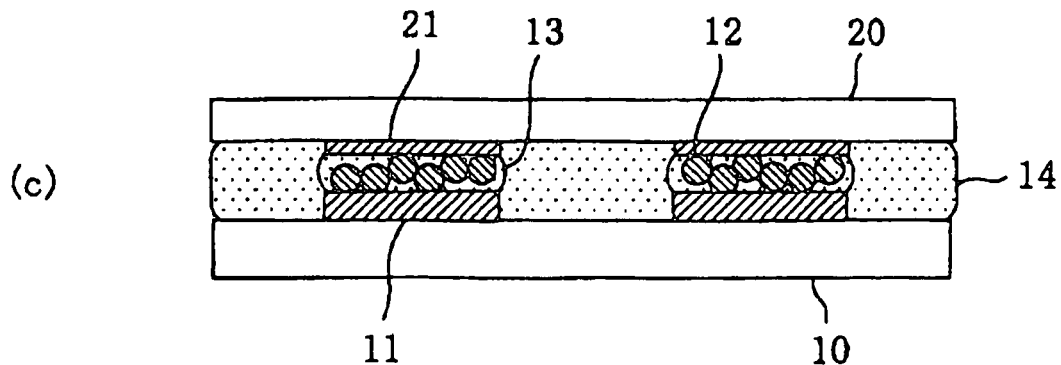

FIG. 4
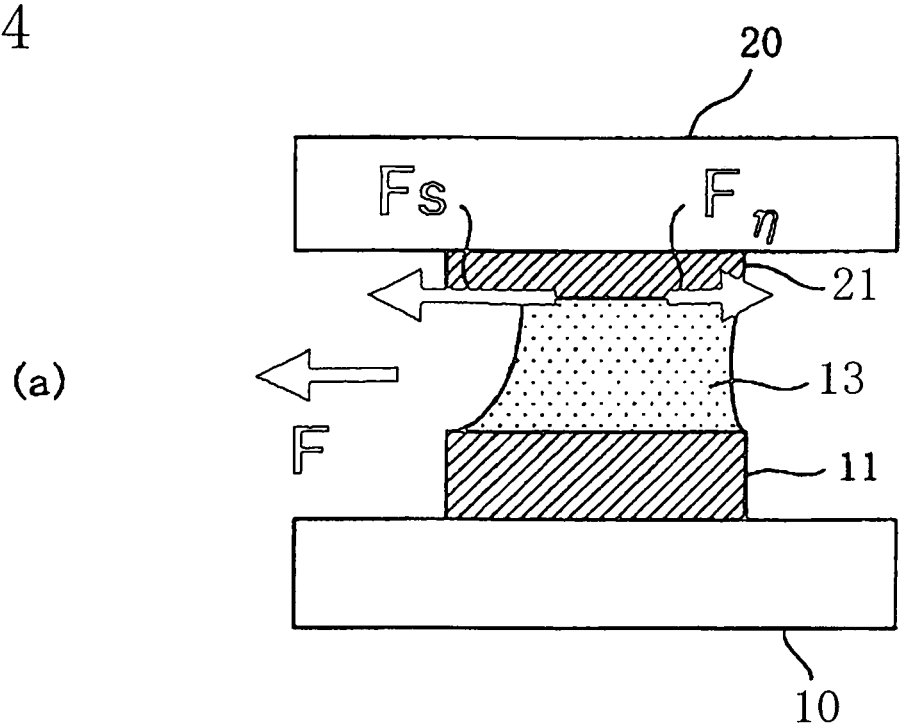
(a)
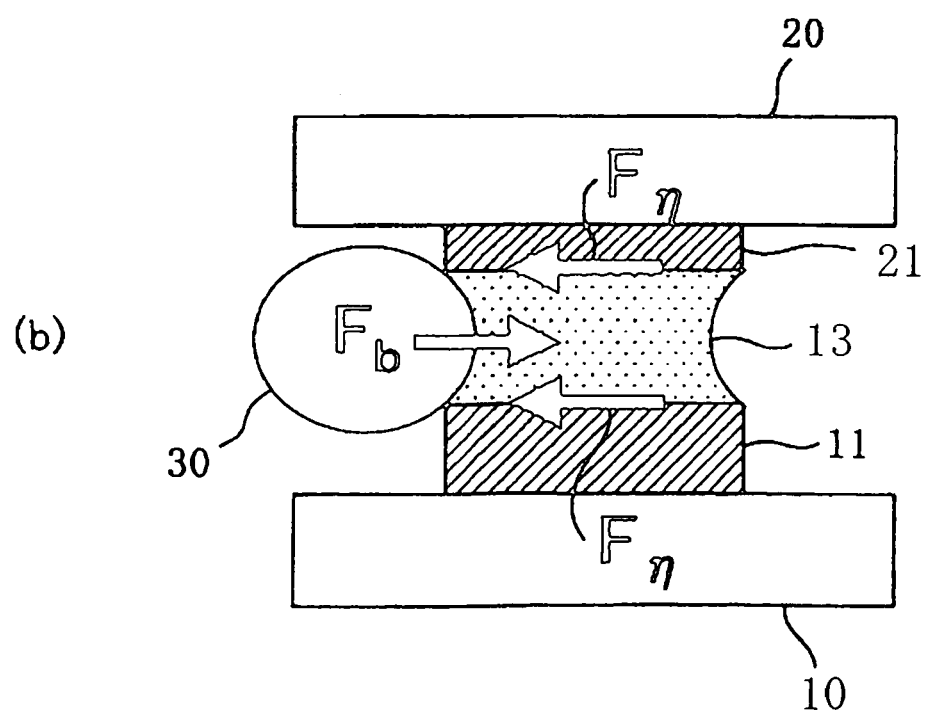
(b)

FIG. 7

| Gas Bubble Generating Agent | Boiling Point (°C) | Gas Bubble Generating Agent | Boiling Point (°C) |
|---|---|---|---|
| hexane | 69 | dimethylamine hydrochloride | 171 |
| vinyl acetate | 72 | dimethyl sulfoxide (DMSO) | 189 |
| isopropyl alcohol | 83 | ethylene glycol | 198 |
| water | 100 | N-methyl-2-pyrrolidone(NMP) | 204 |
| 1,4-dioxane | 101 | α-terpineol | 218 |
| butyl acetate | 126 | butyl carbitol | 231 |
| propionic acid | 141 | butyl carbitol acetate | 246 |

FIG. 8

| Gas Bubble Generating Agent | Decomposition Temperature(°C) |
|---|---|
| boric acid | 70~ |
| ammonium metaborate | 120~ |
| sodium hydrogen carbonate | 120-150 |
| 4,4'-oxybis (benzene sulfonyl hydrazide) (OBSH) | 155-165 |
| azodicarbonamide (ADCA) | 197-210 |
| barium metaborate | 200~ |
| N,N'-dinitrosopentamethylenetetramine (OBSH) | 200-250 |
| aluminum hydroxide | 230 |
| calcium aluminate | 230 |
| dawsonite | 230 |

FLIP CHIP MOUNTING METHOD AND METHOD FOR CONNECTING SUBSTRATES

RELATED APPLICATIONS

This application is a Divisional of U.S. application Ser. No. 11/887,331, filed Sep. 28, 2007, now U.S. Pat No. 7,531,385, which is the U.S. National Phase under 35 U.S.C. §371 of International Application No. PCT/JP 2006/305274, filed on Mar. 16, 2006, which in turn claims the benefit of Japanese Application No. 2005-094233, filed on Mar. 29, 2005, the entire contents of each of which are hereby incorporated by reference.

TECHNICAL FIELD

The present invention relates to a flip chip mounting method for mounting a semiconductor chip on a circuit board and to a method for connecting substrates each formed with a plurality of electrodes.

BACKGROUND ART

In recent years, as semiconductor integrated circuits (LSIs) used in electronic equipment have become higher in density and degree of integration, the electrode terminals of LSI chips have rapidly become higher in pin count and narrower in pitch. To mount such an LSI chip on a circuit board, flip chip mounting has been used widely for a reduction in wiring delay. In the flip chip mounting, it is typical to form solder bumps on the electrode terminals of an LSI chip and simultaneously bond the electrode terminals to connecting terminals formed on a circuit board via the solder bumps.

To mount a next-generation LSI having electrode terminals the number of which is over 5,000, it is needed to form bumps corresponding to a narrower pitch of not more than 100 µm. However, with a current solder-bump forming technology, it is difficult to respond to the need. In addition, it is needed to form a large number of bumps corresponding to the number of electrode terminals. Therefore, to reduce cost, it is also required to achieve high productivity by reducing a mounting tact time per chip.

Likewise, due to an increased number of electrode terminals, the semiconductor integrated circuit has shifted from the use of peripheral electrode terminals to that of area array electrode terminals. Under the higher-density and higher-integration requirements, it is expected that the scale of a semiconductor process advances from 90 nm to 65 nm and 45 nm. As a result, the miniaturization of wiring further proceeds and a wire-to-wire capacitance increases so that problems associated with a higher speed and a power consumption loss have become serious and demand for a low-dielectric-constant (low-k) insulating film between wiring layers has further grown. Such a low-k insulating film can be implemented by porosifying an insulating layer material so that the mechanical strength thereof is low, presenting an obstacle to a reduction in the thickness of a semiconductor. Moreover, when area array electrode terminals are constructed as described above, there is a problem in the strength of a low-k porous film. Consequently, it has become difficult to form bumps on the area array electrodes and perform flip chip mounting itself. As a result, there has been demand for a low-load flip chip mounting method suitable for a higher-density thin semiconductor compatible with the future advancement of a semiconductor process.

As conventional bump forming techniques, a plating method, a screen printing method, and the like have been developed. The plating method is suitable for a narrow pitch, but has a problem in productivity because of complicated process steps. The screen printing method is excellent in productivity, but is not suitable for a narrow pitch because of the use of a mask.

In such a situation, several techniques which selectively form solder bumps on the electrodes of an LSI chip and a circuit board have been developed recently. These techniques are not only suitable for the formation of micro-bumps but also capable of simultaneously forming the bumps so that they are also excellent in productivity and draw attention as techniques applicable to the mounting of a next-generation LSI on a circuit board.

For example, the technique disclosed in Patent Document 1, Patent Document 2, or the like solidly coats a solder paste composed of a mixture of a solder powder and a flux on a substrate having electrodes formed on the surface thereof, melts the solder powder by heating the substrate, and selectively forms solder bumps on the electrodes having high wettability.

The technique disclosed in Patent Document 3 solidly coats a paste-like composition (deposition-type solder using a chemical reaction) containing an organic acid lead salt and metallic tin as main components on a substrate on which electrodes are formed, causes a substitution reaction between Pb and Sn by heating the substrate, and selectively deposits a Pb/Sn alloy on the electrodes of the substrate.

However, each of the techniques disclosed in Patent Documents 1 to 3 shown above supplies a paste-like composition onto the substrate by coating, local variations in thickness and concentration occur. Accordingly, the amount of a deposited solder differs from one electrode to another and bumps having uniform heights cannot be obtained. In addition, since each of the methods supplies the paste-like composition by coating onto the circuit board having projections and depressions formed in the surface thereof, a sufficient amount of the solder cannot be supplied onto the electrodes forming projecting portions so that it is difficult to obtain bumps of desired heights, which is necessary in flip chip mounting.

In flip chip mounting using a conventional bump forming technique, after a semiconductor chip is mounted on a circuit board on which bumps are formed, the step of injecting a resin termed an underfill into the space between the semiconductor chip and the circuit board is further needed to fix the semiconductor chip to the circuit board.

As a method for simultaneously performing the provision of electrical connection between the facing electrode terminals of the semiconductor chip and the circuit board and the fixation of the semiconductor chip to the circuit board, a flip chip mounting technique (see, e.g., Patent Document 4) using an anisotropic conductive material has been developed. The technique supplies a thermosetting resin containing conductive particles into the space between the circuit board and the semiconductor chip and heats the thermosetting resin, while simultaneously pressing the semiconductor chip, thereby simultaneously implementing the electrical connection between the respective electrode terminals of the semiconductor chip and the circuit board and the fixation of the semiconductor chip to the circuit board.

Patent Document 1: Japanese Laid-Open Patent Publication No. 2000-94179
Patent Document 2: Japanese Laid-Open Patent Publication No. HEI 6-125169
Patent Document 3: Japanese Laid-Open Patent Publication No. HEI 1-157796
Patent Document 4: Japanese Laid-Open Patent Publication No. 2000-332055

Patent Document 5: Japanese Laid-Open Patent Publication No. 2002-26070

Patent Document 6: Japanese Laid-Open Patent Publication No. HEI 11-186334

Patent Document 7: Japanese Laid-Open Patent Publication No. 2004-260131

Non-Patent Document 1: Masahito Yasuda et al., "Self-Organized Joining Assembly Process by Electrically Conductive Adhesive Using Low Melting Point Filler" 10th Symposium on "Microjoining and Assembly Technology in Electronics, pp. 183 to 188, 2004)

DISCLOSURE OF THE INVENTION

Problems to be Solved by the Invention

It can be said that flip chip mounting using an anisotropic conductive material is excellent in productivity in terms of simultaneously implementing electrical connection between the respective electrode terminals of a semiconductor chip and a circuit board and fixation of the semiconductor chip to the circuit board. However, as shown below, there are problems to be solved.

The anisotropic conductive material mentioned above has the conductive particles uniformly dispersed in the resin. By pressing the semiconductor chip against the circuit hoard, the dispersed conductive particles are brought into physical contact with the respective electrode terminals of the semiconductor chip and the circuit board, thereby allowing electrical connection between the facing electrode terminals. On the other hand, the resin of the anisotropic conductive material ensures insulation properties between the adjacent electrode terminals.

However, because the conductive particles are uniformly dispersed in the resin, the conductive particles contributing to conduction between the facing electrode terminals are only among all the conductive particles. As a result, it is difficult to obtain a stable conductive state, resulting in a problem that sufficient reliability cannot be provided for electrical connection. Moreover, even though the adjacent electrode terminals are insulated from each other, there is a possibility that sufficient insulation properties cannot be ensured, since the conductive particles not contributing to the conduction between the facing electrode terminals are dispersed in the resin.

Thus, to apply the flip chip mounting using the anisotropic conductive material to a next-generation LSI chip having connecting terminals the number of which is over 5,000, problems associated with reliability remain to be solved.

The present invention has been achieved in view of the foregoing and an object of the present invention is to provide a flip chip mounting method which is applicable to the flip chip mounting of a next-generation LSI and high in productivity and reliability as well as a method for connecting substrates having the same basic process steps as the flip chip mounting method.

Means for Solving the Problems

A flip chip mounting method of the present invention is a flip chip mounting method for disposing a semiconductor chip having a plurality of electrode terminals in facing relation to a circuit board having a plurality of connecting terminals and electrically connecting the connecting terminals of the circuit board to the electrode terminals of the semiconductor chip, the flip chip mounting method comprising: a first step of supplying a resin containing conductive particles and a gas bubble generating agent into a space between the circuit board and the semiconductor chip; a second step of heating the resin to generate gas bubbles from the gas bubble generating agent contained in the resin; a third step of pressing the semiconductor chip against the circuit board; and a fourth step of curing the resin, wherein, in the second step, the resin is pushed toward the outside of the gas bubbles generated from the gas bubble generating agent by growth of the gas bubbles and self-assembled between the connecting terminals of the circuit board and the electrode terminals of the semiconductor chip, in the third step, the conductive particles contained in the resin self-assembled between the terminals come in contact with each other to provide electrical connection between the terminals, and in the fourth step, the resin between the terminals is cured to fix the semiconductor chip to the circuit board.

Preferably, the gas bubble generating agent is composed of a material which boils when the resin is heated. The gas bubble generating agent may be composed of two or more materials having different boiling temperatures. The gas bubble generating agent may also be composed of a material which is thermally decomposed to generate a gas when the resin is heated. For example, the gas bubble generating agent is composed of a compound containing water of crystallization and decomposed to generate water vapor when the resin is heated.

In a preferred embodiment, the second step is performed while the space between the circuit board and the semiconductor chip is varied.

In a preferred embodiment, the first step is performed by supplying the resin containing the conductive particles and the gas bubble generating agent onto the circuit board and then disposing the semiconductor chip on a surface of the resin.

In a preferred embodiment, the fourth step is performed by heating the resin to thermally cure the resin. The flip chip mounting method may also further comprise, after the fourth step, the step of: supplying an underfill material into the space between the circuit board and the semiconductor chip and then curing the underfill material.

In a preferred embodiment, the semiconductor chip having the plurality of electrode terminals has a structure in which a semiconductor bare chip is mounted on an interposer having the plurality of electrode terminals.

A method for connecting substrates of the present invention is a method for connecting substrates by disposing a second substrate having a plurality of electrodes in facing relation to a first substrate having a plurality of electrodes and providing electrical connection between the electrodes of the first substrate and the electrodes of the second substrate, the method comprising: a first step of supplying a resin containing conductive particles and a gas bubble generating agent into a space between the first substrate and the second substrate; a second step of heating the resin to generate gas bubbles from the gas bubble generating agent contained in the resin; a third step of pressing the second substrate against the first substrate; and a fourth step of curing the resin, wherein in the second step, the resin is pushed toward the outside of the gas bubbles generated from the gas bubble generating agent by growth of the gas bubbles and self-assembled between the electrodes of the first substrate and the electrodes of the second substrate, in the third step, the conductive particles contained in the resin self-assembled between the electrodes come in contact with each other to provide electrical connection between the electrodes, and in the fourth step, the resin self-assembled between the electrodes is cured to fix the first substrate to the second substrate.

Preferably, the gas bubble generating agent is composed of a material which boils when the resin is heated.

In a preferred embodiment, the second step is performed while varying the space between the first substrate and the second substrate.

In a preferred embodiment, the first step is performed by supplying the resin containing the conductive particles and the gas bubble generating agent onto the first substrate and then disposing the second substrate on a surface of the resin.

In a preferred embodiment, the flip chip mounting method further comprises, after the fourth step, the step of: supplying an underfill material into the space between the first substrate and the second substrate and then curing the underfill material.

A flip chip mounting method of the present invention is a flip chip mounting body comprising a circuit board having a plurality of connecting terminals and a semiconductor chip having a plurality of electrode terminals and disposed in facing relation to the circuit board such that the connecting terminals of the circuit board are electrically connected to the electrode terminals of the semiconductor chip, wherein the connecting terminals are electrically connected to the electrode terminals by supplying a resin containing conductive particles and a gas bubble generating agent into a space between the circuit board and the semiconductor chip, causing the resin to be self-assembled between the connecting terminals and the electrode terminals, and bringing the conductive particles in the self-assembled resin into contact with each other.

In a preferred embodiment, the flip chip mounting body is fixed with an underfill material supplied into the space between the circuit board and the semiconductor chip.

A flip chip mounting apparatus of the present invention is a flip chip mounting apparatus for flip chip mounting a semiconductor chip on a circuit board, the flip chip mounting apparatus comprising: holding means for holding the semiconductor chip and the circuit board in mutually facing relation with a given space provided therebetween; supplying means for supplying a resin containing conductive particles and a gas bubble generating agent into the space between the semiconductor chip and the circuit board; heating means for heating the resin, and pressing means for pressing the semiconductor chip against the circuit board, wherein the heating means has first heating means for controlling a temperature to a value at which gas bubbles are from the gas bubble generating agent contained in the resin and second heating means for controlling the temperature to a value at which the resin is thermally cured.

In a preferred embodiment, the resin heated with the first heating means is pushed toward the outside of the gas bubbles generated from the gas bubble generating agent by growth of the gas bubbles and self-assembled between connecting terminals of the circuit board and electrode terminals of the semiconductor chip, the semiconductor chip is pressed against the circuit board with the pressing means to bring the conductive particles contained in the resin self-assembled between the terminals into contact with each other and provide electrical connection between the terminals, and the resin is heated with the second heating means to fix the semiconductor chip to the circuit board in a state in which the conductive particles contained in the resin are in contact with each other.

EFFECT OF THE INVENTION

In the flip chip mounting method according to the present invention, by heating the resin containing the conductive particles and the gas bubble generating agent which is supplied into the space between the circuit board and the semiconductor chip, the gas bubbles are generated from the gas bubble generating agent and the resin is pushed toward the outside of the gas bubbles by the growth thereof and allowed to be self-assembled between the connecting terminals of the circuit board and the electrode terminals of the semiconductor chip. Then, by pressing the semiconductor chip against the circuit board, the conductive particles contained in the resin self-assembled between the facing terminals are brought into contact with each other to allow electrical connection between the terminals. This allows the conductive particles dispersed in the resin to be efficiently self-assembled between the terminals and contribute to conduction between the terminals. As a result, a stable conductive state is obtained and electrical connection with high reliability can be achieved.

Likewise, in the method for connecting substrates according to the present invention also, by heating the resin containing the conductive particles and the gas bubble generating agent which is supplied into the space between the facing substrates, the gas bubbles are generated from the gas bubble generating agent and the resin is pushed toward the outside of the gas bubbles by the growth thereof and allowed to be self-assembled between the respective electrodes of the facing substrates. By pressing the substrates against each other, the conductive particles contained in the resin self-assembled between the electrodes are brought into contact with each other to allow electrical connection between the electrodes. This allows the conductive particles dispersed in the resin to be efficiently self-assembled between the electrodes and contribute to conduction between the electrodes. As a result, a stable conductive state is obtained and substrate-to-substrate connection with high reliability can be achieved.

BRIEF DESCRIPTION OF THE DRAWINGS

FIGS. 2(a) to 2(c) are step-by-step cross-sectional views showing the flip chip mounting method in the embodiment;

FIGS. 4(a) and 4(b) are views for illustrating the mechanism of self-assembly of a resin in the present invention;

FIG. 7 is a view showing the materials of a gas bubble generating agent in the present invention;

FIG. 8 is a view showing the materials of a gas bubble generating agent powder which is thermally decomposed in the present invention.

DESCRIPTION OF NUMERALS

Figure 1:
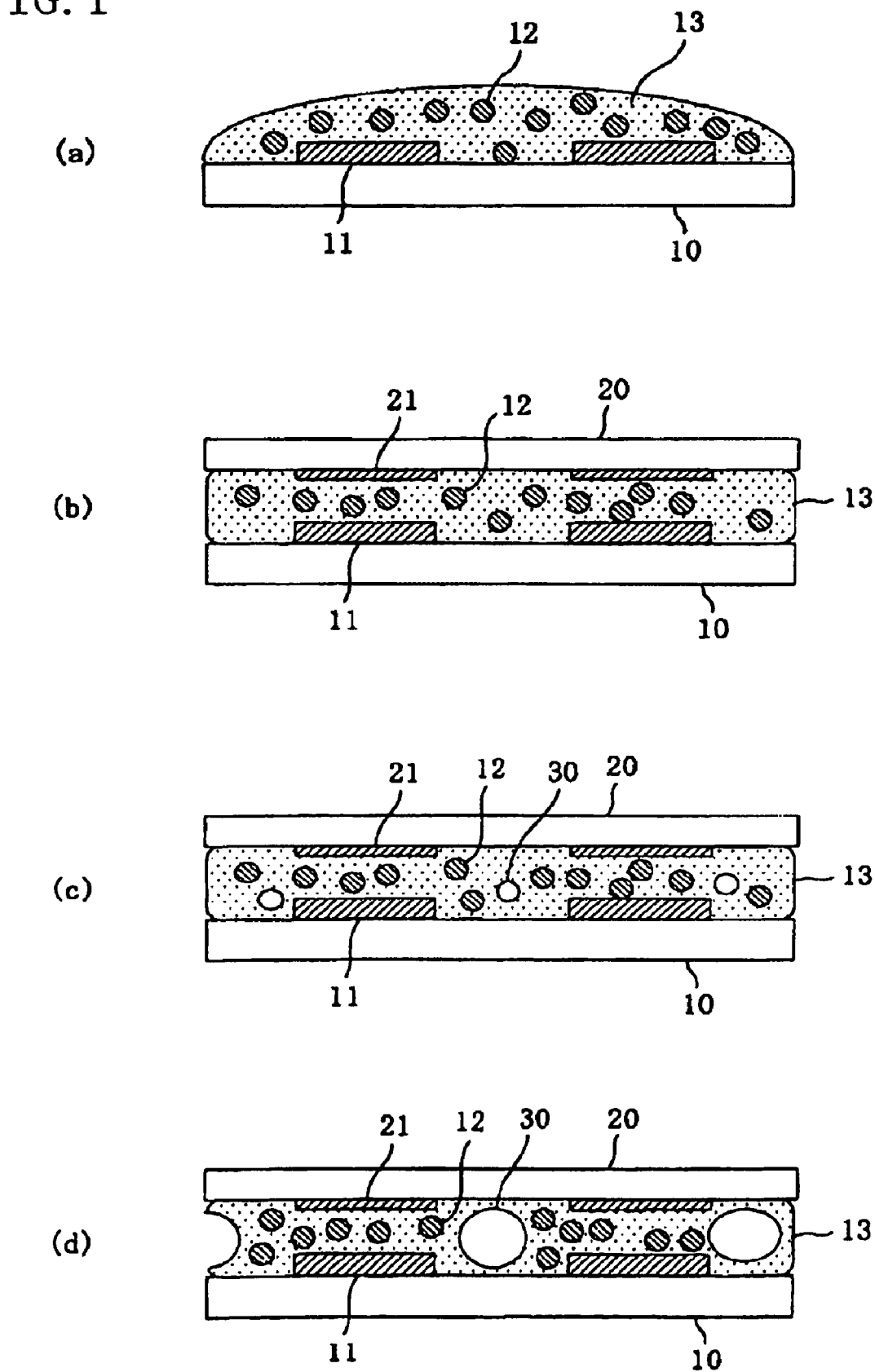
FIGS. 1(a) to 1(d) are step-by-step cross-sectional views showing a flip chip mounting method in an embodiment of the present invention.

10 Circuit Board
11 Connecting Terminal
12 Conductive Particle

13 Resin
20 Underfill Material
21 Semiconductor Chip
30, 30a, 30b Gas bubbles
40 Flip Chip Mounting Apparatus
41 Holding Means
42 Supplying Means
43 Heating Means
44 First Heating Means
45 Second Heating Means
46 Pressing Means

BEST MODE FOR CARRYING OUT THE INVENTION

Referring to the drawings, the embodiments of the present invention will be described herein below. For easier illustration, components having substantially the same functions are designated by the same reference numerals in the drawings shown below. The present invention is not limited to the following embodiments.

FIGS. 1(a) to 1(d) and FIGS. 2(a) to 2(c) are step-by-step cross-sectional views showing the basic steps of a flip chip mounting method in an embodiment of the present invention.

First, as shown in FIG. 1(a), a resin (e.g., an epoxy resin or the like) 13 containing conductive particles (e.g., Cu or the like) 12 and a gas bubble generating agent (e.g., isopropyl alcohol or the like) is supplied onto a circuit board 10 having a plurality of connecting terminals 11. Then, as shown in FIG. 1(b), a semiconductor chip 20 having a plurality of electrode terminals 21 is disposed on the surface of the resin 13 to face the circuit board 10. At this time, the electrode terminals 21 of the semiconductor chip 20 are aligned with respect to the connecting terminals 11 of the circuit board 10.

The steps shown herein may also be such that the circuit board 10 and the semiconductor chip 20 are preliminarily disposed to face each other with a given space (e.g., 10 to 80 µm) interposed therebetween and then the resin 13 containing the conductive particles 12 and the gas bubble generating agent is supplied into the space.

In this state, when the resin 13 is heated to a predetermined temperature (e.g., 100 to 150° C.), gas bubbles 30 are generated from the gas bubble generating agent contained in the resin 13, as shown in FIG. 1(c). Then, as shown in FIG. 1(d), the generated gas bubbles 30 gradually grow so that the resin 13 is pushed by the grown gas bubbles 30 toward the outside thereof.

As shown in FIG. 2(a), the resin 13 pushed to the outside is self-assembled in the form of columns (e.g., generally cylindrical columns) between the connecting terminals 11 of the circuit board 10 and the electrode terminals 21 of the semiconductor chip 20. At this time, most of the resin 13 which is not self-assembled between the terminals is pushed from the space between the circuit board 10 and the semiconductor chip 20 toward the outside under the pressure of the grown gas bubbles 30.

Then, in this state, the semiconductor chip 20 is pressed against the circuit board 10 in the direction indicated by the arrows, as shown in FIG. 2(b). The magnitude of the pressure is set to, e.g., about 20 k to 200 kPa. By the pressing, the conductive particles 12 contained in the resin 13 self-assembled between the facing terminals are brought into contact with each other to provide electrical connection between the terminals. At this time, the electrical connection between the terminals is intended to be achieved with at least one or more conductive particles 12 interposed between the terminals. In pressing, the conductive particles 12 contained in the resin 13 are prevented from flowing out of the resin 13 by the action of a stress resulting from the viscosity of the resin 13.

In this state, the resin 13 self-assembled between the facing terminals is cured to fix the semiconductor chip 20 to the circuit board 10, as shown in FIG. 2(c). Although the resin 13 that has spread over the entire surfaces of the terminals is sufficient to fix the semiconductor chip 20 to the circuit board 10, an underfill material 14 may also be injected as necessary into the space between the semiconductor chip 20 and the circuit board 10 and then cured to enhance the fixation of the semiconductor chip 20 to the circuit board 10. It is also possible to supply the underfill material 14 before pressing the semiconductor chip 20 against the circuit board 10.

In accordance with the present invention, by heating the resin 13 containing the conductive particles 12 and the gas bubble generating agent supplied into the space between the circuit board 10 and the semiconductor chip 20, the gas bubbles are generated from the gas bubble generating agent and, by allowing the gas bubbles to grow and push the resin 13 toward the outside thereof, the resin 13 can be self-assembled between the connecting terminals 11 of the circuit board 10 and the electrode terminals 21 of the semiconductor chip 20. By pressing the semiconductor chip 20 against the circuit board 10, the conductive particles 12 contained in the resin 13 self-assembled between the facing terminals are brought into contact with each other to allow electrical connection between the terminals. This allows the conductive particles 12 dispersed in the resin 13 to be efficiently self-assembled between the terminals and contribute to conduction between the terminals. As a result, a stable conductive state is obtained and electrical connection with high reliability can be achieved.

The sizes of the individual components and the positional relationships therebetween shown in FIGS. 1(a) to 1(d) and FIGS. 2(a) to 2(c) (e.g., the sizes of the conductive particles 12, the size of the spacing between the circuit board 10 and the semiconductor chip 20, and the like) are represented for the convenience of easier illustration and do not show real sizes and the like.

Figure 3:
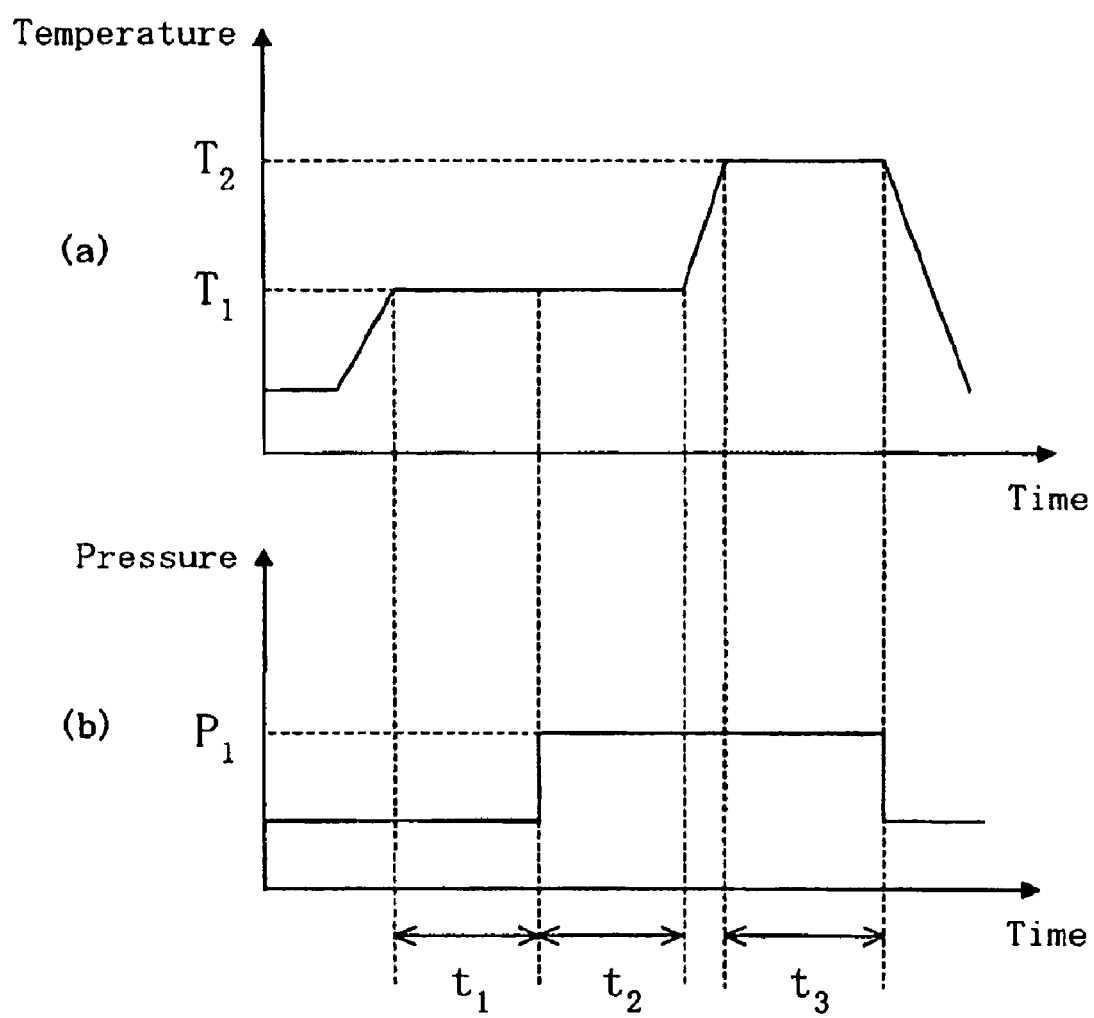
FIG. 3(a) is view showing a temperature profile in heating a resin in the present invention and FIG. 3(b) is a view showing a pressure profile when a semiconductor chip is pressed against a circuit board.

FIGS. 3(a) and 3(b) are graphs showing an example of a temperature profile in the step of heating the resin 13 and an example of a pressure profile in a pressing step in the flip chip mounting method described above.

As shown in FIG. 3(a), the resin 13 is first heated to a temperature $T_1$ at which the gas bubbles 30 are generated from the gas bubble generating agent contained in the resin 13. The temperature $T_1$ is held for a given time $t_1$, during which the generated gas bubbles 30 grow to push the resin 13 towards the outside thereof and the resin 13 is self-assembled in the form of columns between the facing terminals. The temperature $T_1$ is set herein to, e.g., 100 to 180° C. and the given time $t_1$ is set to, e.g., about 5 to 10 seconds.

Then, in the state, the semiconductor chip 20 is pressed under a pressure $P_1$ against the circuit board 10 in the direction indicated by the arrows for a given time $t_2$, as shown in FIG. 3(b). By the pressing, the conductive particles 12 contained in the resin 13 self-assembled between the facing terminals are brought into contact with each other to provide electrical connection between the terminals. At this time, the resin 13 is maintained at a given heating temperature $T_1$. The pressure $P_1$ is set herein to, e.g., 70 to 200 kPa and the given time $t_2$ is set to, e.g., about 0 to 5 seconds.

Finally, as shown in FIG. 3(a), the resin 13 is heated to a temperature $T_3$ at which the resin 13 is cured. The temperature $T_3$ is held for a given time $t_3$ to cure the resin 13 remaining between the facing terminals and thereby fix the semiconductor chip 20 to the circuit board 10. The temperature $T_3$ is set herein to, e.g., 150 to 250° C. and the given time $t_3$ is set to, e.g., about 10 to 20 seconds.

In the temperature profile shown in FIG. 3(a), the heating temperature at which the gas bubbles 30 are generated from the gas bubble generating agent is held at the fixed temperature $T_1$ for the period of the time $t_1$ (or the time $t_1+t_2$). However, it is also possible to gradually increase the temperature during the period of the time.

Referring to FIGS. 4(a) and 4(b), the mechanism of the self-assembly of the resin 13 between the terminals, which is a key point to the flip chip mounting method of the present invention, will be briefly described herein.

FIG. 4(a) is a view showing the state of the resin 13 pushed by the grown gas bubbles (not shown) into the space between one of the connecting terminals 11 of the circuit board 10 and the corresponding electrode terminal 21 of the semiconductor chip 20. The resin 13 that has come in contact with the connecting terminal 11 and the electrode terminal 21 has an interfacial tension (a force resulting from the so-called wet-spreading of a resin) $F_s$ at the interfaces thereof which is larger than a stress $F_\eta$ generated from the viscosity $\eta$ of the resin so that the resin 13 spreads over the entire surfaces of the connecting terminal 11 and the electrode terminal 21 to finally form a columnar resin having boundaries at the end portions of the terminals 11 and 21. Accordingly, even when the positions at which the connecting terminal 11 and the electrode terminal 21 face to each other are slightly displaced, the resin 13 can be reliably self-assembled between the terminals under the interfacial tension.

As shown in FIG. 4(b), a stress $F_b$ resulting from the growth (or movement) of the gas bubbles 30 is applied to the columnar resin 13 formed by self-growth between the terminals. However, the columnar resin 13 can retain the shape thereof under the effect of a reverse stress $F_\eta$ resulting from the viscosity $\eta$ of the resin 13 so that the resin 13 once self-assembled does not disappear. In addition, a surface tension (or a gas-liquid interfacial tension) acts on the boundary between the resin 13 and a gas (e.g., gas bubbles 30) and the surface tension can also act to retain the shape of the columnar resin 13.

As described above, in the flip chip mounting method of the present invention, the growth of the gas bubbles generated from the gas bubble generating agent operates to cause the self-assembly of the resin between the terminals. To further enhance the operation and effect thereof, it is effective in varying the space (gap) between the circuit board 10 and the semiconductor chip 20 in the step of heating the resin.

FIGS. 5(a) to 5(c) are views showing an example in which the gap between the circuit board 10 and the semiconductor chip 20 is varied in the step of generating the gas bubbles from the gas bubble generating agent contained in the resin 13 in the step of heating the resin 13 and causing the resin 13 to be self-assembled between the terminals by the growth of the gas bubbles.

FIG. 5(a) shows the state in which the resin 13 containing the conductive particles 12 and the gas bubble generating agent (not shown) is supplied into the space between the circuit board 10 and the semiconductor chip 20. At this time, the gap $L_1$ between the circuit board 10 and the semiconductor chip 20 is small.

From this state, the resin 13 is heated, while the gap $L_2$ between the circuit board 10 and the semiconductor chip 20 is increased, as shown in FIG. 5(b). In the heating step, the gas bubbles 30 generated from the gas bubble generating agent gradually grow and, in the growing process, the gap $L_2$ between the circuit board 10 and the semiconductor chip 20 is also gradually increased. This allows a given amount of the resin 13 initially supplied into the space between the circuit board 10 and the semiconductor chip 20 to be efficiently self-assembled between the connecting terminals 11 and the electrode terminals 21.

FIG. 5(c) shows the state of the resin 13 self-assembled between the facing terminals at the time at which the gap between the circuit board 10 and the semiconductor chip 20 is $L_3$, in which the resin 13 scarcely remains between the adjacent terminals. This is because most of the resin 13 which is not self-assembled between the terminals is pushed from the space between the circuit board 10 and the semiconductor chip 20 toward the outside under the pressure of the grown gas bubbles 30.

Although the description has been given to the example in which the gap between the circuit board 10 and the semiconductor chip 20 is increased in the heating step in FIGS. 5(a) to 5(c), the same operation and effect can be obtained even when the heating step is performed while periodically varying the gap.

A characteristic feature of the flip chip mounting method of the present invention is that the gas bubbles are generated from the gas bubble generating agent contained in the resin 13 to grow and cause the resin 13 to be self-assembled between the terminals. Although the gas bubble generating agent used in the example shown in FIGS. 1(a) to 1(d) and FIGS. 2(a) to 2(c) is made of one material, the gas bubble generating agent may also be made of two or more materials having, e.g., different boiling temperatures.

Figure 6:
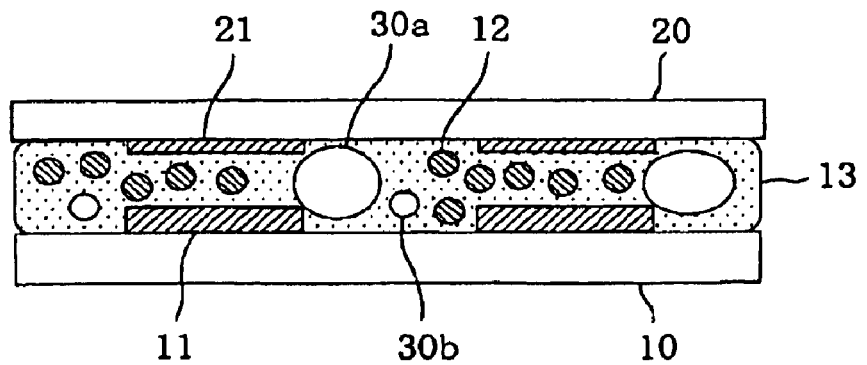
FIG. 6 is a view for illustrating the self-assembly of a resin containing two or more gas bubble generating agents in the present invention.

FIG. 6 is a view showing an example in which two gas bubble generating agents having different boiling temperatures are contained in the resin 13, which shows the state of the gas bubbles generated from the gas bubble generating agents. Gas bubbles 30a generated from the gas bubble generating agent having a lower boiling temperature are larger than gas bubbles 30b generated from the gas bubble generating agent having a higher boiling temperature because the growth of the gas bubbles 30a is temporally leading that of the gas bubbles 30b.

The growing gas bubbles 30b push the resin 13 toward the outside thereof under the growing pressure thereof and can move a part of the resin 13 into the space between the connecting terminals 11 of the circuit board 10 and the electrode terminals 21 of the semiconductor chip 20, while there is also the resin 13 left behind. By repeating the operation of causing the gas bubbles 30b, which are retarded in growth, to push the resin 13 left behind again toward the outside thereof, the resin 13 can be efficiently moved into the space between the terminals. This allows uniform self-assembly of the resin 13 between the terminals.

The resin 13, the conductive particles 12, and the gas bubble generating agent used in the flip chip mounting method of the present invention are not particularly limited, but the following materials can be used respectively therefor.

As the resin 13, there can be used a thermosetting resin such as an epoxy resin, a phenol resin, or a silicone resin, or a thermoplastic resin. However, the resin 13 preferably has a viscosity on the order which at least allows the resin 13 to flow in the heating step.

As the conductive particles 12, Cu, Ag, AgCu, or the like can be used. In the present invention, electrical connection between the terminals is intended to be achieved by contact between the individual conductive particles so that it is preferable to maximally suppress the growth of an oxide film on the surface of each of the conductive particles. It is also possible to implement a state in which only the surfaces of the conductive particles in contact with each other are melted to form metal bonding at the interfaces therebetween. The content of the conductive particles 12 in the resin 13 is preferably in the range of, e.g., about 0.5% to 30% by volume. The content of the gas bubble generating agent in the resin 13 is preferably in the range of, e.g., about 0.1% to 20% by weight.

As the gas bubble generating agent, any of the materials shown in FIG. 7 can be used. To prevent the conductive particles 12 from melting in the heating step for generating the gas bubbles (a gas such as $H_2O$, $CO_2$, or $N_2$) from the gas bubble generating agent, it is necessary to select the material having a boiling temperature lower than the melting temperature of the conductive particles 12 during the generation of the gas bubbles.

As the gas bubble generating agent, a material which is thermally decomposed to generate the gas bubbles when the resin is heated may also be used. As such a gas bubble generating agent, any of the materials shown in FIG. 8 can be used. In the case of using, e.g., a compound containing water of crystallization (aluminum hydroxide), the compound is thermally decomposed when the resin is heated and water vapor is generated as gas bubbles.

In the flip chip mounting method described thus far, the semiconductor chip 20 may also be a structure (such as, e.g., a CSP or a BGA) in which a semiconductor bare chip is mounted on an interposer having a plurality of electrode terminals (lands). The present invention is applicable not only to flip chin mounting but also to substrate-to-substrate connection for achieving electrical connection between the respective electrodes of substrates each having the plurality of electrode terminals. The substrate-to-substrate connection can be achieved by the following method.

First, a resin containing conductive particles and a gas bubble generating agent is supplied into the space between a first substrate and a second substrate each having a plurality of electrodes. Thereafter, the resin is heated to generate gas bubbles from the gas bubble generating agent contained in the resin. In the heating step, the resin is pushed toward the outside of the gas bubbles generated from the gas bubble generating agent by the growth thereof and self-assembled between the electrodes of the first substrate and the electrodes of the second substrate.

Then, the second substrate is pressed against the first substrate to bring the conductive particles contained in the resin self-assembled between the facing electrodes into contact with each other. This allows electrical connection between the facing electrodes.

Finally, the resin self-assembled between the electrodes is cured to fix the first substrate to the second substrate, whereby the substrate-to-substrate connection is completed.

As the first substrate or the second substrate, there can be used a circuit board, a semiconductor wafer, a semiconductor chip (including a bare chip and a mounted chip), or the like.

Figure 5:
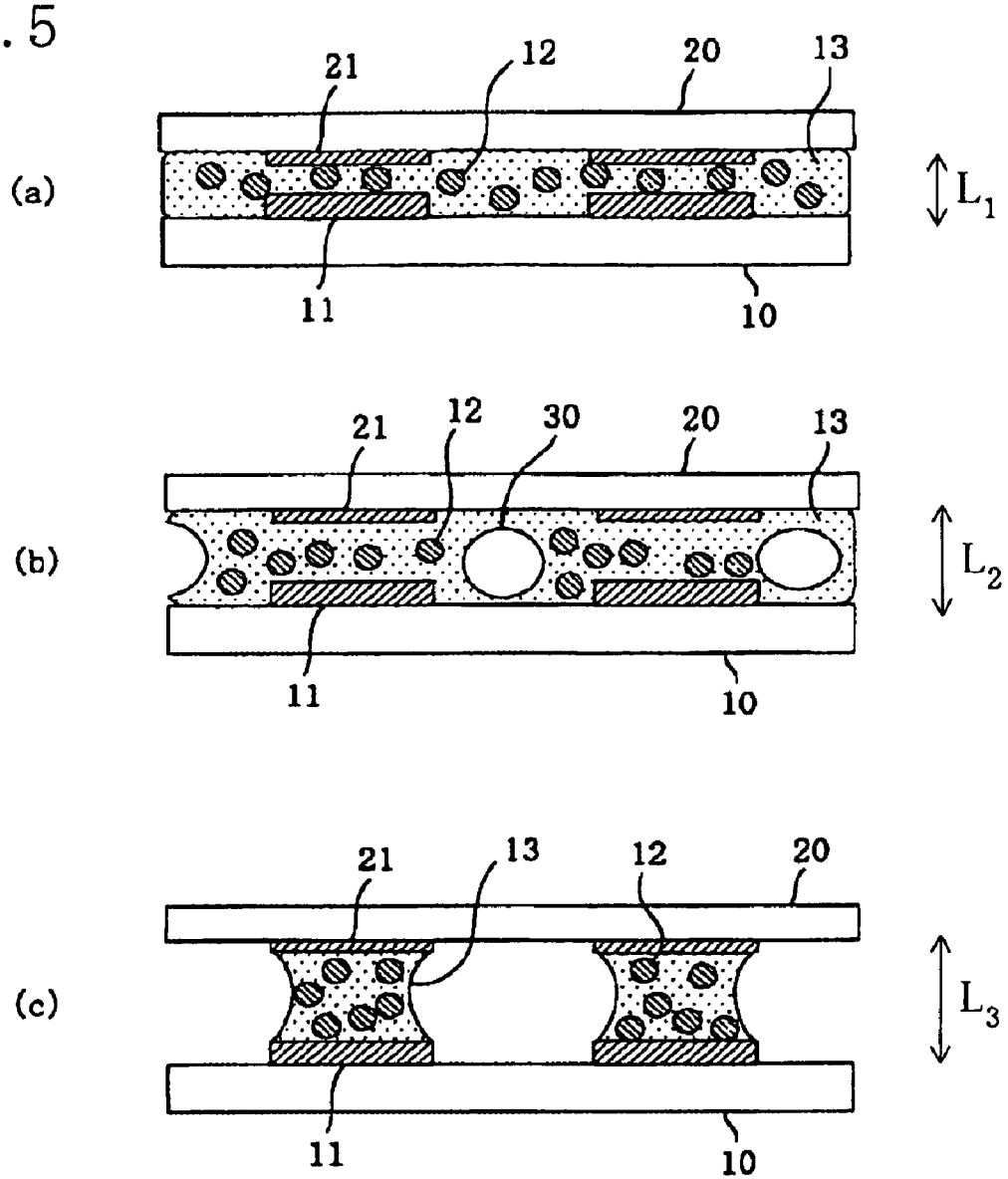
FIG. 5(a) to 5(c) are step-by-step cross-sectional views illustrating a step of performing heating while varying a gap between the circuit board and the semiconductor chip in the present invention.

To the substrate-to-substrate connection also, the various conditions or methods described in the flip chip mounting method described above are applicable. For example, to a temperature profile in the step of heating resin 13, the profile shown in FIG. 3(*a*) is applicable. To the variation in the gap between the substrates, the method shown in FIG. 5 is applicable.

For the resin 13, the conductive particles 12, and the gas bubble generating agent to be used also, the materials described in the flip chip mounting method can also be appropriately selected and used.

Heretofore, the flip chip mounting method and the method for connecting substrates according to the present invention have been described. An apparatus for fabricating a flip chip mounting body by practicing the flip chip mounting method can be implemented with a flip chip mounting apparatus 40 as shown in FIG. 9.

Figure 9:
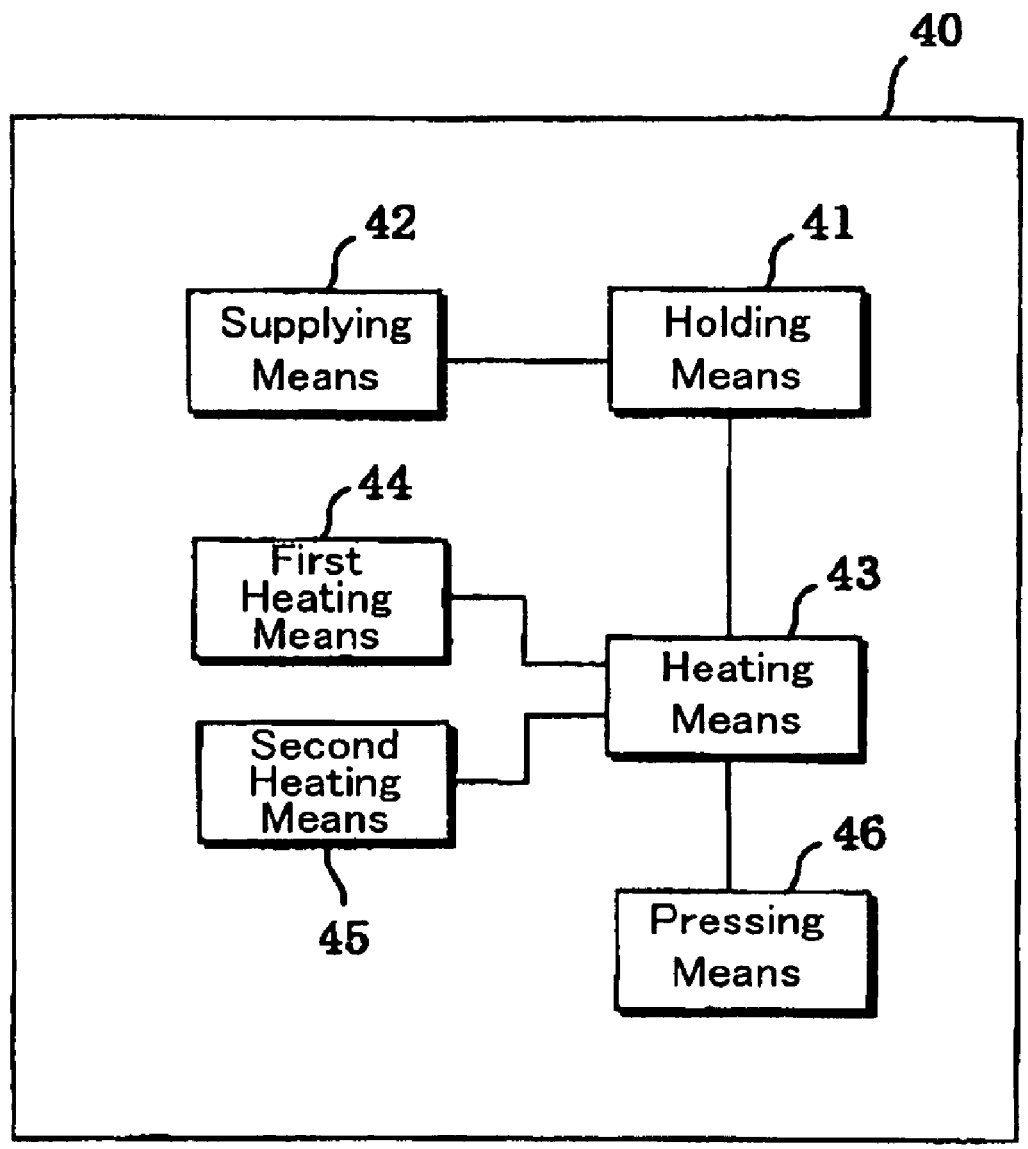
FIG. 9 is a block diagram showing a structure of a flip-chip mounting apparatus in the present invention.

As shown in the block diagram of FIG. 9, the flip chip mounting apparatus 54 comprises holding means 41 for holding the semiconductor chip 20 and the circuit board 10 in mutually facing relation with a given space provided therebetween, supplying means 42 for supplying the resin 13 containing the conductive particles 12 and the gas bubble generating agent into the space between the semiconductor chip 20 and the circuit board 10, heating means 43 for heating the resin 13, and pressing means 46 for pressing the semiconductor chip 20 against the circuit board 10. The heating means 43 has first heating means 44 for controlling a temperature to a value at which the gas bubbles are generated from the gas bubble generating agent contained in the resin 13 and second heating means 45 for controlling the temperature to a value at which the resin 13 is thermally cured.

The holding means 41 has an additional alignment mechanism for aligning the positions of the electrode terminals of the semiconductor chip 20 with respect to those of the connecting terminals of the circuit board 10. When the resin is in the form of a paste, the supplying means 42 can use a dispenser or the like and the heating means 43 can use a heating stage (hot plate) or a heating box (oven) heated with a hot blast or an infrared ray.

In the flip chip mounting apparatus 40, the resin 13 heated with the first heating means 44 is pushed toward the outside of the gas bubbles generated from the gas bubble generating agent by the growth thereof and self-assembled between the connecting terminals 11 of the circuit board 10 and the electrode terminals 21 of the semiconductor chip 20. By further pressing the semiconductor chip 20 against the circuit board 10 with the pressing means 46, the conductive particles 12 contained in the resin 13 self-assembled between the facing electrodes are brought into contact with each other, whereby the flip chip mounting body is completed.

A method which simultaneously performs the provision of electrical connection between the facing terminals of a semiconductor chip and a circuit board and the fixation of the semiconductor chip to the circuit board using a resin containing a solder powder (conductive particles) is disclosed in each of Patent Document 5 (Japanese Laid-Open Patent Publication No. 2002-26070) and Patent Document 6 (Japanese Laid-Open Patent Publication No. HEI 11-186334). In the method disclosed in each of the documents, the respective portions of the facing terminals of the semiconductor chip and the circuit board which are in contact with each other are soldered by melting the solder powder contained in the resin and then the semiconductor chip is encapsulated in and fixed to the circuit board by curing the resin. Although the method disclosed in each of the documents apparently seems to be a similar technique to the present invention, the method solders the terminals by a so-called reflow process. Accordingly, the solder powder is dispersed in the resin even after resin encapsulation and, unlike in the present invention, it is not intended to achieve electrical connection between the terminals by causing the resin containing the conductive particles to be self-assembled between the facing terminals and then bringing the conductive particles contained in the resin into contact with each other. Therefore, the method disclosed in each of the documents is a technique essentially different from the present invention.

On the other hand, a method which simultaneously performs the provision of electrical connection between the facing terminals of a semiconductor chip and a circuit board and the fixation of the semiconductor chip to the circuit board, each using a resin containing conductive particles (low-melting-point metal filler), is described in each of Patent Document 7 (Japanese Laid-Open Patent Publication No. 2004-260131) and Non-Patent Document 1 (Masahiro Yasuda et al., "Self-Organized Joining Assembly Process by Electrically Conductive Adhesive Using Low Melting Point Filler" 10th Symposium on "Microjoining and Assembly Technology in Electronics, pp. 183 to 188, 2004). Each of the documents discloses a technique in which conductive particles selectively form self-organized connectors between terminals by using a resin having an oxidizing/reducing ability based on the aggregation and wetting of the molten metal filler contained in the resin.

However, Patent Document 7 and Non-Patent Document 1 do not go beyond indicating the probability of a process which selectively (in a self-assembled manner) joins the facing terminals and merely causes aggregation (self-assembly) by relying only on the wettability of the molten conductive particles. As a result, it is difficult to uniformly form the connectors between the terminals.

The present invention has been achieved based on the recognition that, since the resin containing the conductive particles does not function as the "sea" in which the conductive particles can freely move, the bonding process of the conductive particles does not uniformly proceed and, consequently, uniform connectors cannot be formed between the terminals. Therefore, by applying the method according to the present invention, it is possible to perform high-yield flip chip mounting of a semiconductor chip having a large number of electrode terminals so that a useful method applicable to a mass production process is provided.

Although the present invention has thus been described using the preferred embodiments thereof, such a description is not a restrictive matter and various modifications can be naturally made.

INDUSTRIAL APPLICABILITY

In accordance with the present invention, it is possible to provide a flip chip mounting method which is applicable to the flip chip mounting of a next-generation LSI and high in productivity and reliability as well as a method for connecting substrates.

What is claimed is:

1. A flip chip mounting apparatus for flip chip mounting a semiconductor chip on a circuit board, the flip chip mounting apparatus comprising:
    holding means for holding the semiconductor chip and the circuit board in mutually facing relation with a given space provided therebetween;
    supplying means for supplying a resin containing conductive particles and a gas bubble generating agent into the space between the semiconductor chip and the circuit board;
    heating means for heating the resin, and
    pressing means for pressing the semiconductor chip against the circuit board, wherein
    the heating means has first heating means for controlling a temperature to a value at which gas bubbles are from the gas bubble generating agent contained in the resin and second heating means for controlling the temperature to a value at which the resin is thermally cured.

2. The flip chip mounting apparatus according to claim 1, wherein
    the resin heated with the first heating means is pushed toward the outside of the gas bubbles generated from the gas bubble generating agent by growth of the gas bubbles and self-assembled between connecting terminals of the circuit board and electrode terminals of the semiconductor chip,
    the semiconductor chip is pressed against the circuit board with the pressing means to bring the conductive particles contained in the resin self-assembled between the terminals into contact with each other and provide electrical connection between the terminals, and
    the resin is heated with the second heating means to fix the semiconductor chip to the circuit board in a state in which the conductive particles contained in the resin are in contact with each other.

* * * * *

UNITED STATES PATENT AND TRADEMARK OFFICE
CERTIFICATE OF CORRECTION

PATENT NO. : 7,820,021 B2
APPLICATION NO. : 12/078891
DATED : October 26, 2010
INVENTOR(S) : Seiji Karashima et al.

Page 1 of 1

It is certified that error appears in the above-identified patent and that said Letters Patent is hereby corrected as shown below:

On the Title Page of the patent:

In Item "(56) References Cited", under "FOREIGN PATENT DOCUMENTS", insert -- US 2002/0185309 A1 --.

Signed and Sealed this
Eighth Day of March, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,820,021 B2 | Page 1 of 1 |
| APPLICATION NO. | : 12/078891 | |
| DATED | : October 26, 2010 | |
| INVENTOR(S) | : Seiji Karashima et al. | |

It is certified that error appears in the above-identified patent and that said Letters Patent is hereby corrected as shown below:

On the Title Page of the patent:

In Item "(56) References Cited", under "U.S. PATENT DOCUMENTS", insert -- US 2002/0185309 A1 --.

This certificate supersedes the Certificate of Correction issued March 8, 2011.

Signed and Sealed this
Fourteenth Day of June, 2011

David J. Kappos
*Director of the United States Patent and Trademark Office*